(12) United States Patent
Sik

(10) Patent No.: US 6,337,467 B1
(45) Date of Patent: Jan. 8, 2002

(54) LAMP BASED SCANNING RAPID THERMAL PROCESSING

(75) Inventor: Yoo Woo Sik, Palo Alto, CA (US)

(73) Assignee: WaferMasters, Inc., San Jose, CA (US)

( * ) Notice: Subject to any disclaimer, the term of this patent is extended or adjusted under 35 U.S.C. 154(b) by 0 days.

(21) Appl. No.: 09/568,450

(22) Filed: May 9, 2000

(51) Int. Cl.$^7$ ............................................... F27D 11/00
(52) U.S. Cl. ..................... 219/411; 219/390; 219/405; 392/416; 392/418; 118/724; 118/50.1
(58) Field of Search ................................. 219/390, 405, 219/411; 392/416, 418; 118/724, 725, 50.1; 250/492.22; 362/298, 301, 302, 304

(56) References Cited

U.S. PATENT DOCUMENTS

| | | | |
|---|---|---|---|
| 4,356,384 A | 10/1982 | Gat | 219/347 |
| 4,436,985 A | * 3/1984 | Weber | 219/388 |
| 4,707,217 A | 11/1987 | Aklufi | 156/617 |
| 4,755,654 A | 7/1988 | Crowley et al. | 219/405 |
| 5,073,698 A | 12/1991 | Stultz | 219/405 |
| 5,756,369 A | 5/1998 | Aronowitz et al. | 438/16 |
| 5,811,327 A | 9/1998 | Funai et al. | 438/166 |
| 5,840,118 A | 11/1998 | Yamazaki | 117/103 |
| 5,893,952 A | 4/1999 | Aronowitz et al. | 118/725 |
| 5,937,282 A | 8/1999 | Nakajima et al. | 438/149 |
| 6,080,965 A | * 6/2000 | Osawa | 219/405 |

FOREIGN PATENT DOCUMENTS

JP   11 097370   4/1999   ........... H01L/21/26

\* cited by examiner

*Primary Examiner*—Teresa Walberg
*Assistant Examiner*—Shawntina T. Fuqua
(74) *Attorney, Agent, or Firm*—Skjerven Morrill MacPherson LLP

(57) ABSTRACT

An apparatus, system, and method for uniformly and controllably heating the active surface of a semiconductor wafer during processing. The present invention includes a scanner assembly, which is operable to scan over a single semiconductor wafer. A radiation energy source is provided enclosed within the main body of the scanner assembly. The radiation energy source may be surrounded by a reflective/absorptive surface, which reflects and absorbs the emitted radiation, such that the resultant energy output is substantially free of non-uniformities. The reflected energy is directed through a slit in the scanner assembly to the wafer. The narrow wavelength band of energy allowed to escape the scanner assembly is uniformly scanned over the wafer to heat only the active layer of the wafer surface.

24 Claims, 5 Drawing Sheets

LAMP BASED SCANNING RAPID THERMAL PROCESSING

BACKGROUND OF THE INVENTION

1. Field of the Invention

This invention generally relates to semiconductor manufacturing equipment and, more particularly, to equipment for rapid thermal processing of a semiconductor wafer.

2. Description of Related Art

To make semiconductor devices of decreased dimensions, new processing and manufacturing techniques have had to be developed. One important requirement for the new techniques is to be able to reduce the amount of time that a semiconductor wafer is exposed to high temperatures during processing. One such processing technique designed to address this requirement is know as Rapid Thermal Processing (RTP). The rapid thermal processing technique, typically includes quickly raising the temperature of the wafer and holding it at that temperature for a time long enough to successfully perform a fabrication process, while avoiding such problems as unwanted dopant diffusion that would otherwise occur at the high processing temperatures.

Generally, conventional RTP systems use a light source and reflectors to heat the bulk of the semiconductor wafer. The light source is usually a bank of Halogen lamps that emit radiation energy that is focused on the wafer by the reflectors.

Conventional Halogen lamp-based RTP systems have considerable drawbacks with regard to achieving and maintaining a uniform temperature distribution across the active layer of the wafer surface. For example, the Halogen lamp has a filament, which generates broadband radiation. By applying more power to the filament, the intensity of the lamp can be increased. However, silicon wafers are heated using a useable band of short wavelengths, and are otherwise transparent to wavelengths outside of this band. The peak intensity of the lamp tends to increase the wavelengths outside of the useable wavelength band. As a consequence, much of the applied power is wasted.

Another drawback to filament type lamps is that they generally create a wavelength distribution that is non-uniform and independently uncontrollable. Consequently, temperature fluctuations occur on the surface of the wafer which may cause crystal defects and slip dislocations in the wafer at high temperatures (e.g. ~1000° C.).

One particular solution to the drawbacks of Halogen lamp-based systems is disclosed in U.S. Pat. No. 5,893,952. In the 952 patent, an apparatus is described for rapid thermal processing of a wafer using a narrow band beam of electromagnetic radiation generated by a high wattage laser. The beam is directed at the wafer, through a thin absorption film, which absorbs substantially all the energy from the beam, which, in turn, radiates heat to the wafer. Unfortunately, the apparatus described above has some limitations and drawbacks. For example, the thickness of the thin film must be accurately determined. If the thin film is too thin, energy from the beam may be transmitted directly to the wafer, or if the thin film is too thick the film may not heat up fast enough for rapid thermal processing. A film must be used that does not degrade over time, and must not sputter, bubble, or degas when heated, otherwise non-uniform absorption will result. Because of the requirements placed on the thin absorption film, the materials for this film are limited. As a result, the same RTP apparatus may heat wafers differently and unpredictably, which wastes both time and materials.

For the above reasons, what is needed is an apparatus, system, and method for uniformly and controllably heating the surface of a semiconductor wafer during rapid thermal processing.

SUMMARY OF THE INVENTION

The present invention provides an apparatus, system, and method for uniformly and controllably heating the active surface of a semiconductor wafer during processing. The present invention may include a scanner assembly which is operable to scan over a single semiconductor wafer. As described in greater detail below, a radiation energy source is provided enclosed within the main body of the scanner assembly. The radiation energy source may be surrounded by a reflective/absorptive surface, which both reflects and absorbs the radiation, emitted from the energy source such that the resultant energy output as seen by the wafer is substantially free of non-uniformities. The reflected energy is directed through a slit in the scanner assembly. Advantageously, the narrow band of energy allowed to escape the scanner assembly is uniformly scanned over the wafer to heat only the active layer of the wafer surface. Because the beam is uniform over the diameter of the wafer there is no heating overlap.

In one aspect of the present invention, an apparatus is provided for rapid thermal processing of a wafer. The apparatus includes a radiation energy source, preferably a filament-less lamp. The apparatus further includes a scanning assembly operable to scan a beam of the radiation energy across the surface of a wafer. The radiation energy is used to heat an active layer of the wafer.

In another aspect of the present invention, an apparatus for rapid thermal processing of a semiconductor wafer is provided. The apparatus includes a housing which defines a reflecting chamber. Within the reflecting chamber is disposed a radiation energy source. To allow at least a portion of the radiation energy to escape the reflecting chamber, a radiation outlet channel is also provided. Also provided is a scanner, which is operable to scan the radiation energy escaping from the reflecting chamber across the surface of a wafer to heat an active layer of the wafer.

In yet another aspect of the present invention, a method is provided for rapid thermal processing of a semiconductor wafer. The method includes providing a source of radiation energy and scanning a semiconductor wafer with a narrow band of the radiation energy to raise the temperature of an active layer of the semiconductor wafer.

Because the scanning RTP system of the present invention is designed to heat only the active region of the wafer surface, the process is advantageous for implant anneal applications, such as shallow junction, ultra shallow junction, and source drain anneal. The scanning RTP system may also be used effectively for thermal donor annihilation, recrystallization, and $H_2$ anneal. Moreover, since the bulk of the semiconductor wafer need not be heated during the heating process, the amount of power used by the RTP system can be reduced to less than 50 kWh, preferably, less than about 10 kWh. Similarly, scanning times, and therefore processing times, may be reduced since only the active surface of the wafer is being heated.

These and other features and advantages of the present invention will be more readily apparent from the detailed description of the preferred embodiments set forth below taken in conjunction with the accompanying drawings.

DETAILED DESCRIPTION

Figure 1B:
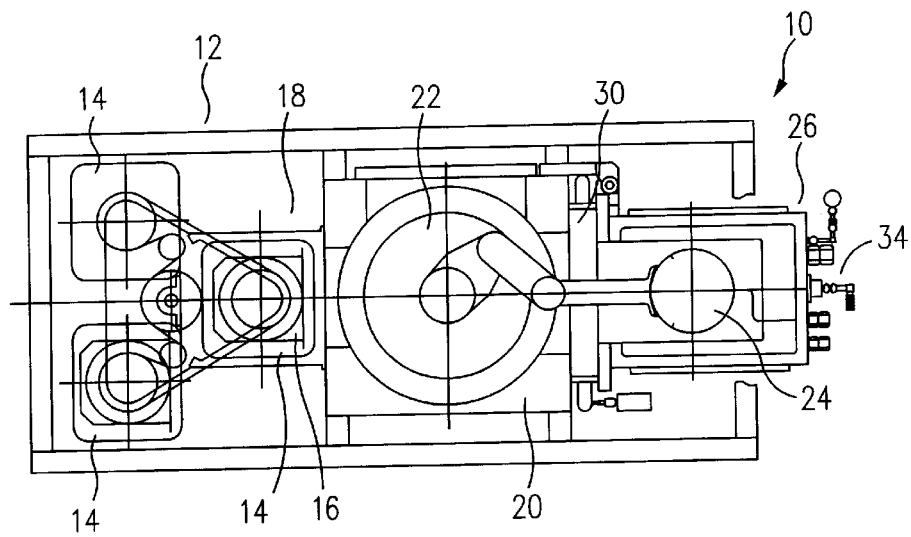
FIGS. 1A and 1B are schematic illustrations of a side view and top view, respectively, of one embodiment of a semiconductor wafer processing system that establishes a representative environment of the present invention.
Figure 1A:
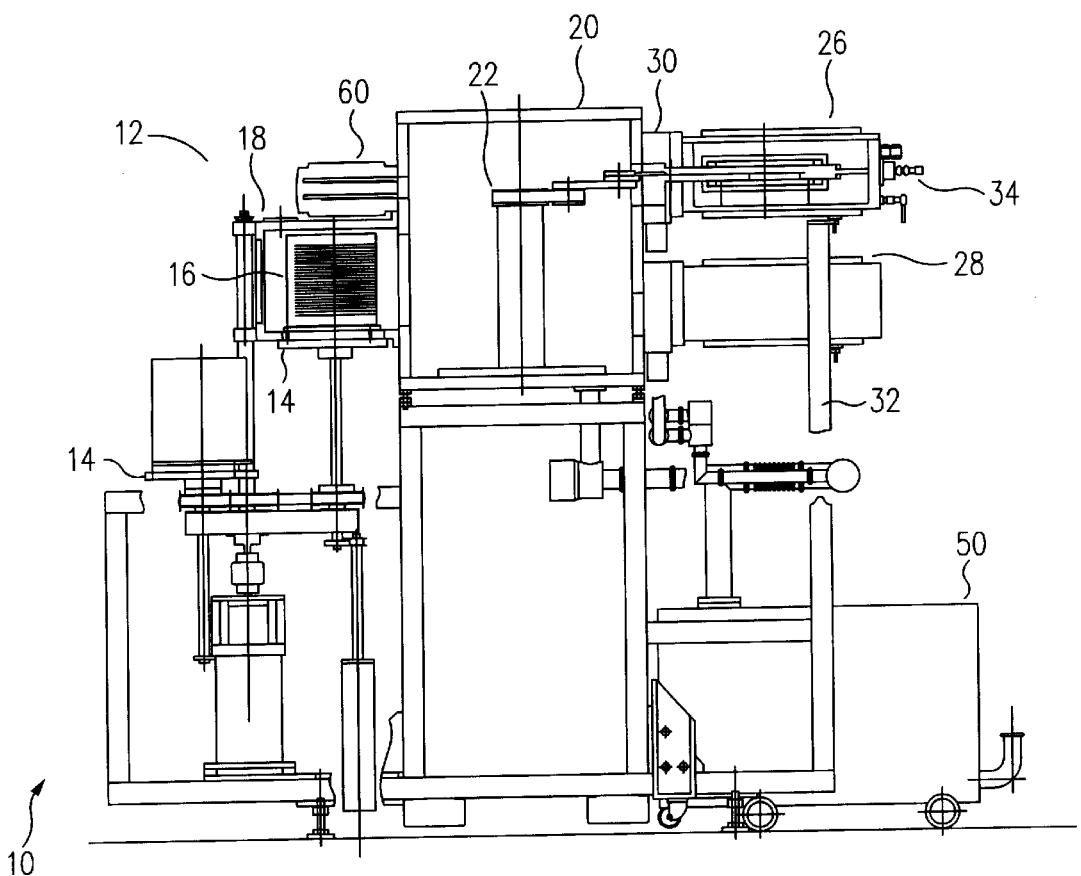

FIGS. 1A and 1B are schematic illustrations of a side view and top view, respectively, of one embodiment of a semiconductor wafer processing system 10 that establishes a representative environment of the present invention. The representative system is fully disclosed in co-pending U.S. patent application Ser. No. 09/451,677, filed Nov. 30, 1999, which is herein incorporated by reference for all purposes. Processing system 10 includes a loading station 12 which has multiple platforms 14 for supporting and moving a wafer cassette 16 up and into a loadlock 18. Wafer cassette 16 may be a removable cassette which is loaded into a platform 14, either manually or with automated guided vehicles (AGV). Wafer cassette 16 may also be a fixed cassette, in which case wafers are loaded onto cassette 16 using conventional atmospheric robots or loaders (not shown). Once wafer cassette 16 is inside loadlock 18, loadlock 18 and transfer chamber 20 are maintained at atmospheric pressure or else are pumped down to vacuum pressure using a pump 50. A robot 22 within transfer chamber 20 rotates toward loadlock 18 and picks up a wafer 24 from cassette 16. A reactor or thermal processing chamber 26, which may also be at atmospheric pressure or under vacuum, accepts wafer 24 from robot 22 through a gate valve 30. Optionally, additional reactors may be added to the system, for example reactor 28. Robot 22 then retracts and, subsequently, gate valve 30 closes to begin the processing of wafer 24. After wafer 24 is processed, gate valve 30 opens to allow robot 22 to pick-up and place wafer 24 into a cooling station 60. Cooling station 60 allows the newly processed wafers, which may have temperatures upwards of 100° C., to cool before they are placed back into a wafer cassette in loadlock 18.

In accordance with the present invention, reactors 26 and 28 are RTP reactors, such as those used in thermal anneals, dopant diffusion, thermal oxidation, nitridation, chemical vapor deposition, and similar processes. Reactors 26 and 28 are generally horizontally displaced, however in a preferred embodiment, reactors 26 and 28 are vertically displaced; (i.e. stacked one over another) to minimize floor space occupied by system 10. Reactors 26 and 28 are bolted onto transfer chamber 20 and are further supported by a support frame 32. Process gases, coolant, and electrical connections may be provided through the rear face of the reactors using interfaces 34.

Figure 2A:
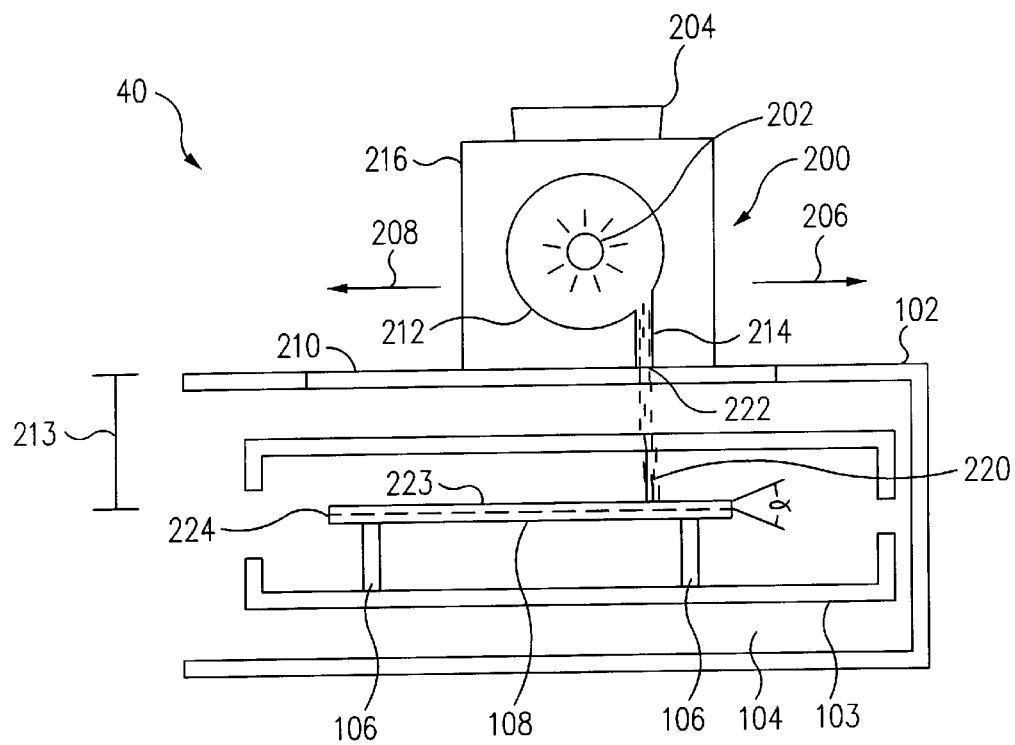
FIG. 2A is a simplified illustration of an RTP reactor system in accordance with the principles of the present invention.

FIG. 2A a illustrates of an embodiment of RTP reactor system 40 in accordance with the principles of the present invention. In this embodiment, reactor system 40 includes a process chamber 102 and a scanner assembly 200. Scanner assembly 200 may be positioned proximate to process chamber 102, such that in operation, the scanner assembly can be made to adequately scan the wafer disposed in the chamber.

In a preferred embodiment, process chamber 102 may include a closed-end tube 103, defining an interior cavity 104. Within tube 103 are wafer support posts 106, typically three (of which two are shown), to support a single wafer 108. An opening or aperture (not shown) on one end of tube 103, provides access for the loading and unloading of wafer 108 before and after processing. The aperture may be a relatively small opening, but large enough to accommodate a wafer of between about 0.5 to 0.8 mm thick and up to 300 mm (~12 in.) in diameter, and the arm and end effector of robot 22. Preferably, the aperture is no greater than between about 18 mm and 22 mm, preferably 20 mm. The relatively small aperture size helps to reduce radiation heat loss from tube 103.

Because wafer 108 is loaded and un-loaded using robot 22, tube 103 requires no internal moving parts to position wafer 108, such as lift pins, actuators, and the like. Thus, tube 103 may be constructed with a minimal internal volume-surrounding wafer 108. In a preferred embodiment, the volume of interior cavity 104 is usually no greater than about 5000 $cm^3$, and preferably the volume is no greater than about 3000 $cm^3$. Accordingly, the small tube volume allows reactor system 40 to be made smaller, and as a result, system 10 may be made smaller, requiring less floor space. Preferably, tube 103 is made of a transparent quartz or similar material.

FIG. 2A also illustrates scanner assembly 200, which may be used in conjunction with a radiation energy source 202, to provide rapid thermal processing of semiconductor wafer 108. Scanner assembly 200 includes a housing 216 which supports an actuator 204, a reflecting chamber 212, and a radiation outlet channel 214. The external dimensions of housing 216 are determined by the application. For example, the length of housing 216 may be at least as great, or greater than the diameter of wafer 108.

Actuator 204 provides a conventional means for making scanner assembly 200 operable to scan wafer 108. Actuator 204 may be configured to provide a back and forth scanning motion, as indicated in FIG. 2A by arrows 206 and 208, along a scanning length of tube 103. Actuator 204 may include, but is not limited to, conventional drivers and motion translation mechanisms, such as linear motors, stepper motors, hydraulic drives, and the like, and gears, pulleys, chains, and the like.

Figure 2B:
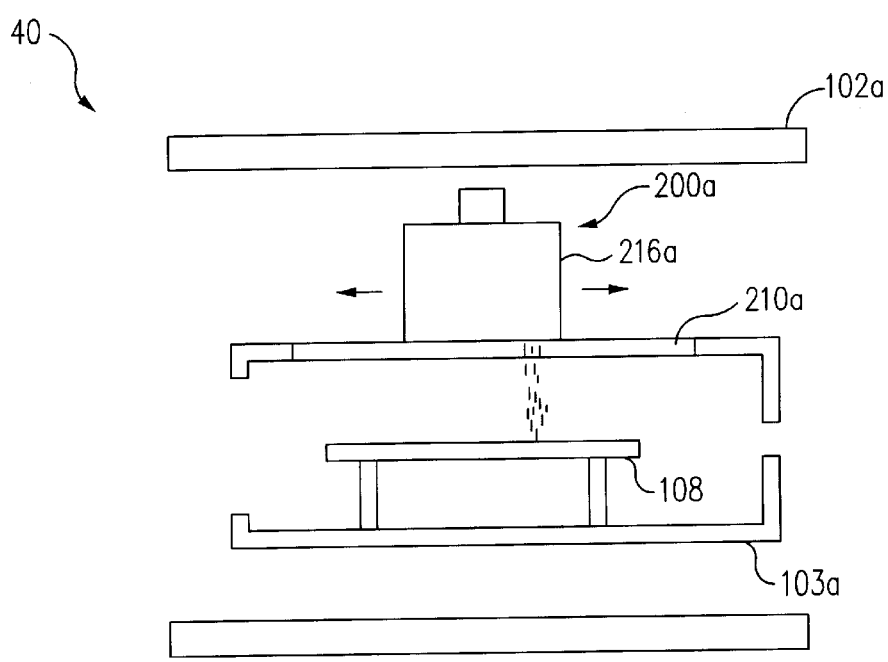
FIG. 2B is a simplified illustration of an RTP reactor system in accordance with an alternative embodiment of the present invention.

In the embodiment shown in FIG. 2A, scanner assembly 200 may be mounted external to both process chamber 102 and tube 103. Scanner assembly 200 is positioned above an optical window 210, which is provided along the scanning length of chamber 102 (i.e. at least as great as the diameter of wafer 108) to allow the radiation energy emitted from housing 216 to enter tube 103 and impinge on wafer 108. In an alternative embodiment shown in FIG. 2B, the scanning motion of scanner assembly 200a may take place internal to process chamber 102a, but external to tube 103a. Scanner assembly 200a is positioned above optical window 210a, formed on tube 103a along the scanning length (i.e. at least as great as the diameter of wafer 108) to allow the radiation energy emitted from housing 216a to enter tube 103a and impinge on wafer 108.

Figure 2C:
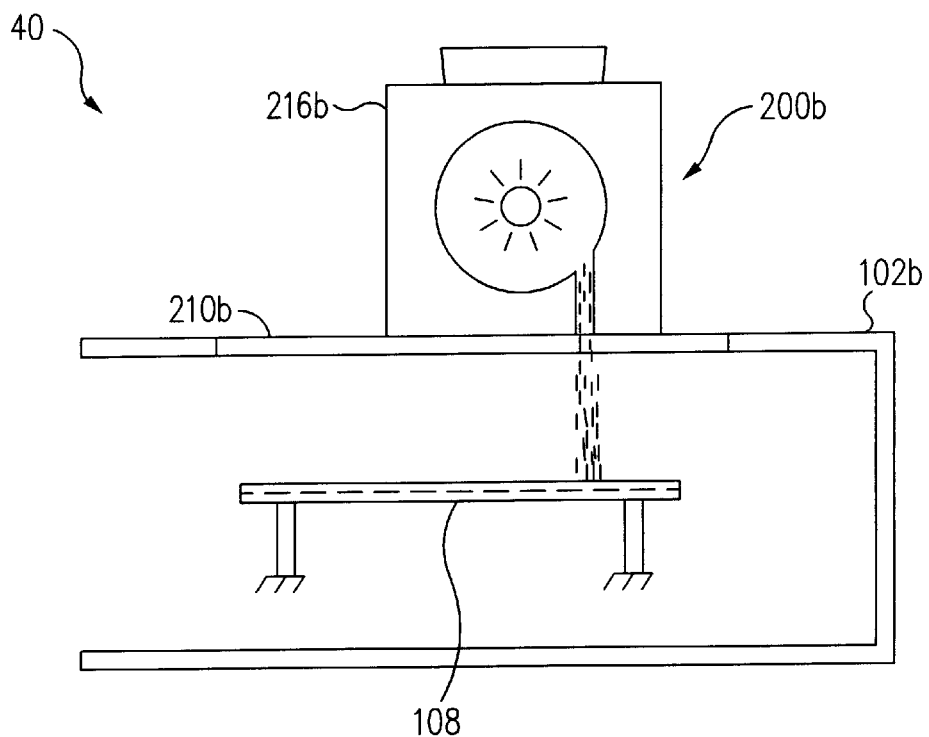
FIG. 2C is a simplified illustration of an RTP reactor system in cordance with an alternative embodiment of the present invention.

In yet another embodiment, shown in FIG. 2C, scanner assembly 200b may be mounted external to process chamber 102b, with no process tube. In this embodiment, scanner assembly 200b is positioned above optical window 210b, which is provided along the scanning length of chamber 102b (i.e. at least as great as the diameter of wafer 108) to allow the radiation energy emitted from housing 216b to impinge on wafer 108.

Optical window 210 (or 210a) may be made of any material that allows for the transmission of the radiation energy, preferably quartz. Window 210 may have a thickness of between about 1 and about 5 mm and a diameter that is at least as great or greater than wafer 108.

Whether the scanner assembly is positioned inside or outside of the tube, the distance between the surface of the wafer and the scanner assembly, indicated in FIG. 2A as gap 213, should be no greater than about 50 mm, preferably between about 10 mm and 25 mm. The relatively small gap 213 ensures that adequate control of the temperature distribution across wafer 108 is maintainable. A larger gap 213 may cause some of the radiation energy to be escape before it impinges on wafer 108.

As further illustrated in FIG. 2A, reflective chamber 212 and radiation outlet channel 214 are disposed within housing 216. Radiation source 202 is disposed within reflective chamber 212, typically positioned such that substantially all of the broadband radiation is allowed to impinge on an internal surface 218 of the chamber. In one embodiment, radiation energy source 202 may be a high-intensity lamp of the type conventionally used in lamp heating operations. In a preferred embodiment, radiation energy source 202 is a filament-less lamp, such as a Xe arc lamp. Typical power requirements for the preferred lamp 202 of the present invention are between about 500 Watts and about 50 kWatts.

The energy emitted from lamp 202 impinges inner surface 218 of chamber 212, which is highly reflective of certain wavelengths and absorptive or non-reflective of others. In one embodiment, surface 218 is coated with a material which has the reflecting/absorbing characteristic. For example, surface 218 may be coated with gold or silver, where the silver is further coated with a protection coating, such as SiN or any transparent coating, which prohibits oxidation of the silver. Preferably, the coating efficiently reflects wavelengths of less than 900 nm, to produce an average wavelength of between about 900 nm and about 200 nm.

Figure 3:
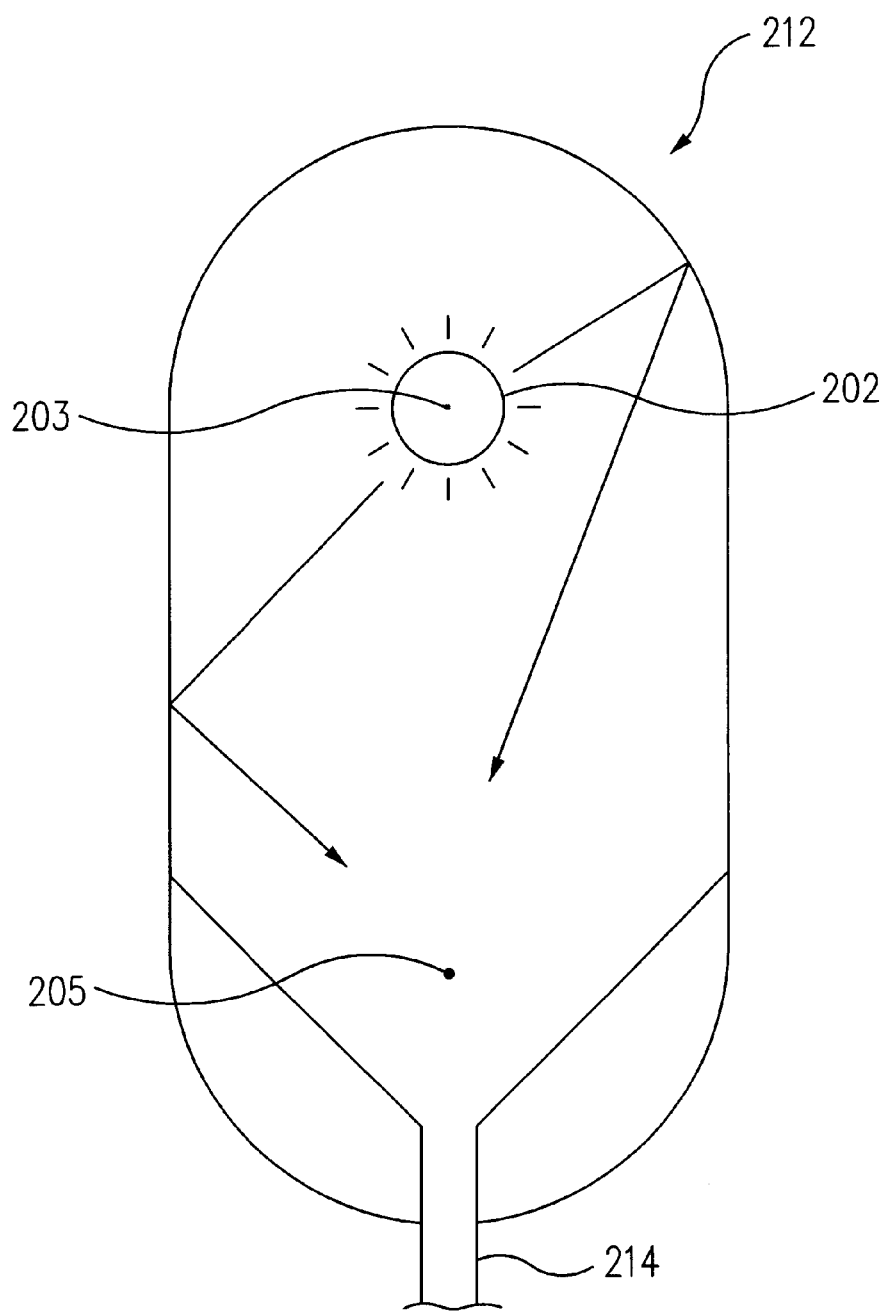
FIG. 3 is a simplified illustration of an embodiment of a radiation amber in accordance with the present invention.

Chamber 212, which may be formed into any suitable geometric shape. For example, as shown in FIG. 2A, chamber 212 may be a round chamber. In a round chamber 212 light energy can be focused at the center of chamber 212 and directed toward radiation outlet channel 214, described below. In this example, radiation energy source 202 can be off-center in chamber 212 to ensure that the focused light energy does not over heat energy source 202. FIG. 3 shows an alternative example of chamber 212, which may be formed into an elliptical chamber. Elliptical chamber 212 can have two focal points. Energy source 202 can be positioned at a first focal point 203, such that the light energy is focused at the second focal point 205 and directed to radiation outlet channel 214.

Referring again to FIG. 2A, the narrow-band energy escapes from chamber 212 through radiation outlet channel 214. Radiation outlet channel 214 can be about 5 mm to 20 mm long; preferably about 10 mm long, to adequately direct the radiation energy along the desired path. Radiation outlet channel 214 has an opening or slit 222 formed on the end of the channel which allows a beam 220 of the radiation energy to escape housing 216. Slit 222 is designed to shape beam 220 as desired, such that an optimal amount of energy may be focused on wafer 108. In a preferred embodiment, slit 222 may be a rectangular opening, which extends the length of scanner assembly 200, and is as great, or greater than the diameter of wafer 108. The size of the opening should be small enough to minimize the amount of energy, which will naturally disperse at the slit opening. Thus, slit 222 may have a width of between about 1 mm and 10 mm, preferably 2 mm. As beam 222 is scanned over wafer 108, a uniform temperature distribution is created across the surface of wafer 108, which heats an active layer 224 of the wafer.

Figure 2D:
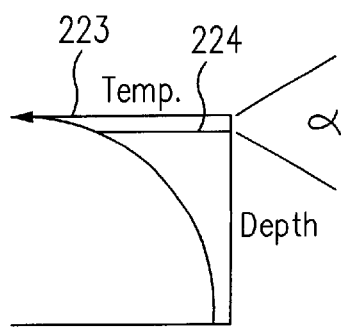
FIG. 2D is a simplified illustration of the active layer of a miconductor wafer in accordance with principles of the present invention.

Referring now to FIGS. 2A and 2D, active layer or device layer 224 is a portion of wafer 108, which extends from surface 223 of wafer 108 down to a depth a below surface 223. The depth a is typically between about 0.05 $\mu$m and 1 mm, but will vary with the process and device feature size. Active layer 224 is well known in the semiconductor manufacturing industry as that portion of the wafer in which semiconductor devices are formed, such as transistors, diodes, resistors, and capacitors.

It should be understood that the temperature to which active layer 224 is heated is a function of the relationship between the speed at which scanner assembly 200 is moved across wafer 108 and the power supplied to lamp 202. In an exemplary embodiment, the temperature of active layer 224 may range from between about 500° C. to about 1200° C. To achieve these temperatures, the scan rate may vary between about 1 mm/sec to about 10 mm/sec at 500 watts to 50 kwatts. The slower the scan rate, the less power is required. In one embodiment, wafer 108 can be pre-heated, for example, to about 300° C., such that the processing of active layer 224 begins at the higher temperature, which reduces processing time and saves energy.

Heating active layer 224 using reactor system 40 increases the diffusion rate and solubility of active layer 224. Thus, a shallow doped region may be created in active layer 224. Doping the active layer includes scanning active layer 224 to a process temperature, for example, from between about 500° C. to about 1200° C., in an environment of a doping compound, such as boron, phosphorus, nitrogen, arsenic, $B_2H_6$, $PH_3$, $N_2O$, NO, $AsH_3$, and $NH_3$. The concentration of the compound may range from about 0.1% to about 100% relative to a carrier gas, such as $H_2$, $N_2$ and $O_2$ or a non-reactive gas, such as argon or helium. Higher concentrations of the compound can speed up the doping process and/or increase the dopant concentration within the active layer.

Figure 4:
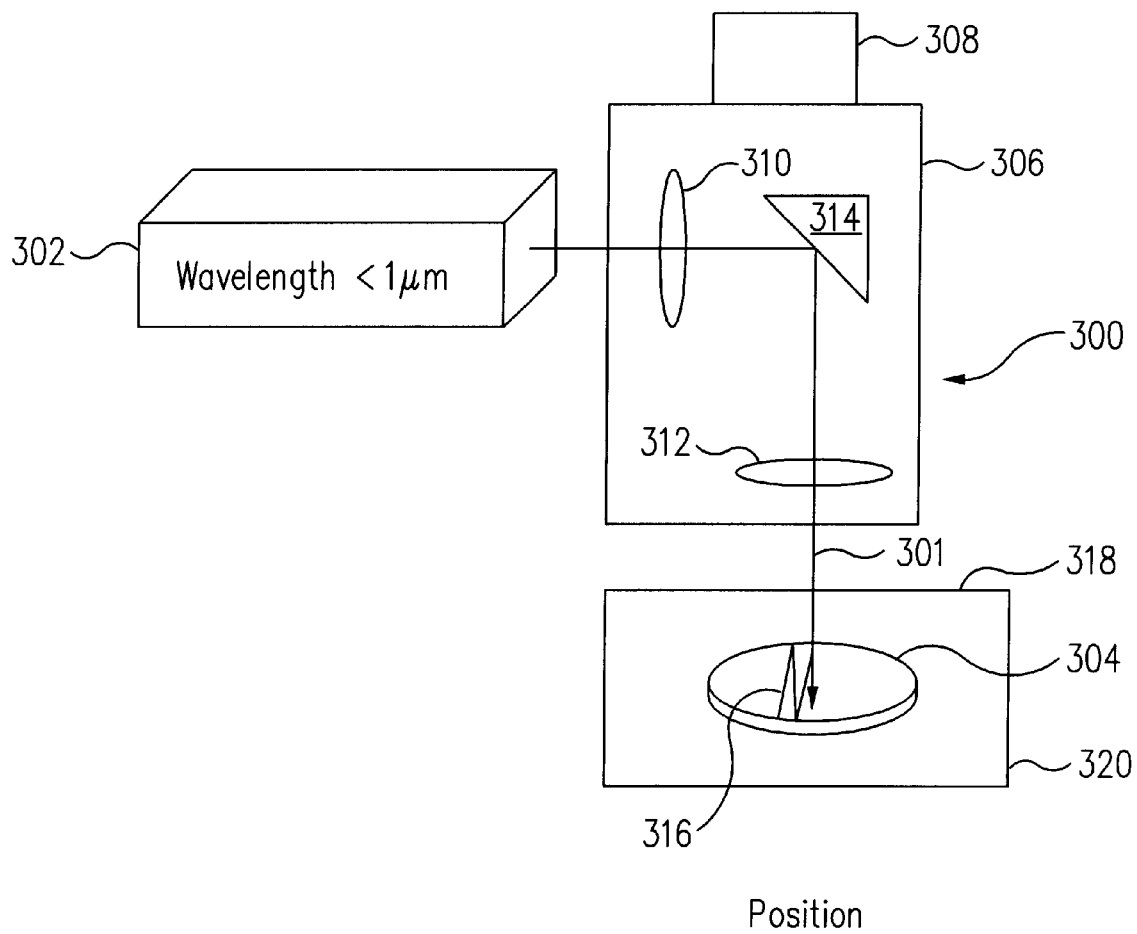
FIG. 4 is a simplified illustration of another embodiment of the resent invention.

FIG. 4 is a simplified illustration of yet another embodiment of the present invention. In this embodiment, scanner assembly 300 includes a high intensity pulse or continuous wave laser 302 to provide rapid thermal processing of semiconductor wafer 304. Scanner assembly 300 also includes a laser energy focusing assembly 306 and an actuator 308. The components of scanning assembly 300 may be enclosed in a single housing, which is mountable on to a process chamber 320 in a manner similar to the embodiments described above in FIG. 2A.

Laser focusing assembly 306 includes a first focusing lens 310, a second focusing lens 312, and mirror 314. Focusing assembly operates in a well-known, conventional manner to focus the laser energy 301 from laser 302 onto wafer 304. The laser energy 301 from laser 302 can have a wavelength of less than 1 $\mu$m.

Actuator 308 provides a conventional means for making scanner assembly 300 operable to scan wafer 304. Actuator 308 may be configured to move laser 302 and focusing assembly 306 to provide a back and forth scanning motion across wafer 304, as indicated in FIG. 4 by arrow 316. Alternatively, only mirror 314 may be moved to cause the laser scanning of wafer 304. In yet another alternative embodiment, wafer 304 may be made to move, such that a stationary beam 301 can be made to scan the wafer surface. Actuator 308 may include, but is not limited to, conventional drivers and motion translation mechanisms, such as linear motors, stepper motors, hydraulic drives, and the like, and gears, pulleys, chains, and the like. In one embodiment, scanner assembly 300 is positioned above an optical window 318, which is provided along the scanning length of process chamber 320 to allow the laser energy to enter process chamber 320 and impinge on wafer 304. Window 318 may be made of any material that allows for the transmission of laser energy 301; preferably transparent quartz. Window 318 may have a thickness of between about 1 and about 5 mm and a diameter that is at least as great or greater than wafer 304.

The present invention overcomes many of the disadvantages of RTP systems using Halogen lamps. For example, filament-type Halogen lamps produce broadband energy, much of which cannot be used to heat the active layer of the wafer. To increase the amount of useable wavelengths in the filament-type lamp, power to the lamp is increased. Unfortunately, this increase in power shifts the peak intensity. The arc lamp used in the present invention does not shift peak intensity with an increase in power and thus can be made to perform at a peak intensity that is within the useable band of wavelengths. As a consequence, the added power is more efficiently consumed at the active layer.

Having thus described embodiments of the present invention, persons skilled in the art will recognize that changes may be made in form and detail without departing from the spirit and scope of the invention. Thus the invention is limited only by the following claims.

What is claimed is:

1. A system for rapid thermal processing of a semiconductor wafer, said system comprising:
   a housing defining a reflecting chamber;
   a radiation energy source disposed in said reflecting chamber;
   a radiation outlet channel configured to concentrate radiation energy therein, said outlet channel defining a slit;
   a scanning assembly operable to scan across the surface of a wafer a beam of said concentrated radiation energy escaping from said slit to allow said concentrated radiation energy to heat an active layer of said wafer.

2. The system of claim 1, wherein said radiation energy source comprises a high-intensity lamp.

3. The system of claim 2, wherein said high-intensity lamp comprises a Xe arc lamp.

4. The system of claim 1, wherein said radiation energy comprises an average power of between about 500 Watts and 50 kWatts.

5. A system for rapid thermal processing of a semiconductor wafer, said system comprising:
   a radiation energy source; and
   a scanning assembly operable to scan a beam of said radiation energy across the surface of a wafer, said radiation energy heating an active layer of said wafer, said active layer being a portion of said wafer between 0.05 $\mu$m and about 1 mm below a surface of said wafer.

6. The system of claim 1, wherein a temperature of said active layer is between about 500° C. and 1200° C.

7. The system of claim 1, wherein a reaction time for thermal processing is between about 1 millisecond and about 1 second.

8. The system of claim 1, wherein said scanner assembly comprises a reflector for focusing said radiation energy.

9. The system of claim 8, wherein said reflector reflects wavelengths of less than about 900 nm.

10. The system of claim 1, wherein a distance between a surface of said wafer and a portion of said scanning assembly is less than 10 mm.

11. An apparatus for rapid thermal processing of a semiconductor wafer, said apparatus comprising:
    a housing defining a reflecting chamber;
    a radiation energy source disposed in said reflecting chamber;
    a radiation outlet channel configured to concentrate radiation energy from said radiation energy source and allow at least a portion of said concentrated radiation energy to escape said reflecting chamber; and
    a scanner mechanism operable to scan a beam of said radiation energy escaping from said reflecting chamber across the surface of a wafer, said radiation energy heating an active layer of said wafer.

12. The apparatus of claim 11, wherein said radiation energy source comprises a high-intensity lamp.

13. The apparatus of claim 12, wherein said high-intensity lamp comprises a Xe arc lamp.

14. The apparatus of claim 11, wherein said beam of radiation energy comprises an average power of between about 500 Watts and 50 kWatts.

15. The apparatus of claim 11, wherein said beam of radiation energy comprises an average wavelength of between about 900 nm and 200 nm.

16. An apparatus for rapid thermal processing of a semiconductor wafer, said apparatus comprising:
    a housing defining a reflecting chamber;
    a radiation energy source disposed in said reflecting chamber;
    a radiation outlet channel being configured to allow at least a portion of said radiation energy to escape said reflecting chamber; and
    a scanner mechanism operable to scan a beam of said radiation energy escaping from said reflecting chamber across the surface of a wafer, said radiation energy heating an active layer of said wafer, said active layer being a portion of said wafer between about 0.05 $\mu$m and about 1 mm below a surface of said wafer.

17. The apparatus of claim 11, wherein an inner surface of said reflecting chamber is coated with a material taken form the group consisting of silver and gold.

18. The apparatus of claim 11, wherein said channel further comprises a slit to focus said radiation energy into said beam.

19. A method for rapid thermal processing of a semiconductor wafer, said method comprising:
    providing a source of radiation energy disposed in a reflecting chamber including a radiation outlet channel configured to concentrate said radiation energy therein, said outlet channel defining a slit; and
    scanning a semiconductor wafer with a narrow band of said radiation energy escaping from said slit to raise the temperature of an active layer of said semiconductor wafer.

20. The method of claim 19, wherein said source of radiation energy comprises a high-intensity filament-less lamp.

21. The method of claim 19, wherein said lamp comprises a Xe arc lamp.

22. A method for rapid thermal processing of a semiconductor wafer, said method comprising:

providing a source of radiation energy; and scanning a semiconductor wafer with a narrow band of said radiation energy to raise the temperature of an active layer of said semiconductor wafer, said active layer being a portion of said wafer extending from a surface of said wafer to a distance between about 0.05 µm and about 1 mm below said surface.

23. The method of claim 19, wherein a temperature of said active layer is between about 500° C. and 1200° C.

24. The method of claim 19, further comprising focusing said radiation energy such that a narrow energy band is generated having an average wavelength of between about 900 nm and 200 nm.

* * * * *

UNITED STATES PATENT AND TRADEMARK OFFICE
CERTIFICATE OF CORRECTION

PATENT NO.     : 6,337,467 B1
DATED          : January 8, 2002
INVENTOR(S)    : Yoo, Woo Sik It is certified that error appears in the above-identified patent and that said Letters Patent is hereby corrected as shown below:

Title page,
Item [12], Inventor's name should read -- [12] YOO -- and
Item [75] should read as follows:
-- [75] Inventor: Woo Sik Yoo, Palo Alto, CA (US) --

Signed and Sealed this

Twenty-eighth Day of January, 2003

JAMES E. ROGAN
*Director of the United States Patent and Trademark Office*